United States Patent [19]

Niitsuma et al.

[11] Patent Number: 4,993,000
[45] Date of Patent: Feb. 12, 1991

[54] SURFACE ACOUSTIC WAVE DEVICE

[76] Inventors: Teruo Niitsuma; Syuichi Mitsutsuka, both of 35-2, Hakusan 5-chome, Bunkyo-ku, Tokyo, Japan

[21] Appl. No.: 455,163

[22] Filed: Dec. 22, 1989

[30] Foreign Application Priority Data

Dec. 22, 1988 [JP] Japan .................. 63-324399

[51] Int. Cl.⁵ ............................ H04R 17/00
[52] U.S. Cl. ...................... 367/140; 310/313 R; 333/154; 333/151; 333/194
[58] Field of Search ............ 367/140; 333/150, 151, 333/154, 193, 194; 310/313 R, 313 B

[56] References Cited

U.S. PATENT DOCUMENTS

| | | | |
|---|---|---|---|
| 3,872,331 | 3/1975 | Falco | 333/150 |
| 4,291,285 | 9/1981 | Kadota | 333/150 |
| 4,315,275 | 2/1982 | Bert et al. | 333/154 |
| 4,699,682 | 10/1987 | Takishima | 333/154 |
| 4,757,226 | 7/1988 | Mitsutska et al. | 310/313 R |

Primary Examiner—Charles T. Jordan
Assistant Examiner—J. Woodrow Eldred
Attorney, Agent, or Firm—Wallenstein, Wagner & Hattis, Ltd.

[57] ABSTRACT

A surface acoustic wave device according to the present invention can be molded surely with resin, leaving a free space over exciting portions and a propagating portion by disposing a recess portion formed over the exciting portions and the propagating portion on a piezoelectric substrate without using any metallic package.

13 Claims, 7 Drawing Sheets

SURFACE ACOUSTIC WAVE DEVICE

BACKGROUND OF THE INVENTION

The present invention relates to a surface acoustic wave device, and in particular to an improvement in the sealing structure for the exciting portions and the propagating portion thereof.

Heretofore, in the case where a surface acoustic wave element is sealed while leaving a free space over the exciting portions and the propagating portion thereof, sealing structures indicated in FIGS. 14 and 15 are often used.

FIG. 14 shows a case where it is sealed in a metallic package, where reference numeral 1 is a surface acoustic wave element; 2 is the metallic package; 3 is an exciting transducer; 4 is an in- and output pin; 5 is a metallic cap; and 6 is conductive paste. The surface acoustic wave element 1 is mounted fixedly on a stem of the metallic package 2 by means of adhesive or the conductive paste 6. Each of a pair of exciting transducers 3 is connected electrically with an in- and output pin 4 of the package by wire bonding and the whole is sealed by covering it with the metallic cap 5 so that a free space is assured on the surface of the exciting portions and the propagating portion stated above.

FIG. 15 shows a case where it is sealed by resin mold, where reference numeral 7 is a surface acoustic wave element; 8 is a lead terminal; 9 is a resin mold; 10 is an air gap; and 11 is conductive paste. Each of electrodes on the surface of the element is connected with a lead terminal 8 by solder or the conductive paste 11. Before the step of sealing with mold resin 9 wax is applied to the surface of the exciting portions and the propagating portion so that the air gap 10 is formed at the same time as the formation of the resin mold.

However, for the sealing structure indicated in FIG. 14, since the metallic package is relatively expensive, it is difficult to lower the cost.

On the other hand, although the sealing structure indicated in FIG. 15 can be obtained with a low cost, it is feared that the surface of the surface acoustic wave element is polluted. Further, in the case where an air gap of large surface is required, it is difficult to apply wax uniformly thereto. Therefore, since fluctuations take place in the formation of the air gap, it has a drawback that the fabrication yield is lowered.

OBJECT OF THE INVENTION

The object of the present invention is to provide a surface acoustic wave device capable of realizing to lower the cost and to improve the fabrication yield, for which it is possible to form the resin mold in the state where an air gap is left over the exciting portions and the propagating portion therein without using any expensive metallic package.

SUMMARY OF THE INVENTION

In order to achieve the above object, according to the present invention, it is tried to solve the problems described above by disposing a recess portion on a piezoelectric substrate, where two exciting portions and a propagating portion are formed, forming a taking out electrode extending from each of the exciting portions in the recess portion to the surface outside of the recess portion, and covering the recess portion with a plate-shaped cover.

DETAILED DESCRIPTION

FIGS. 1 to 7 show an embodiment, in which the present invention is applied to a surface acoustic wave filter.

Figure 1:
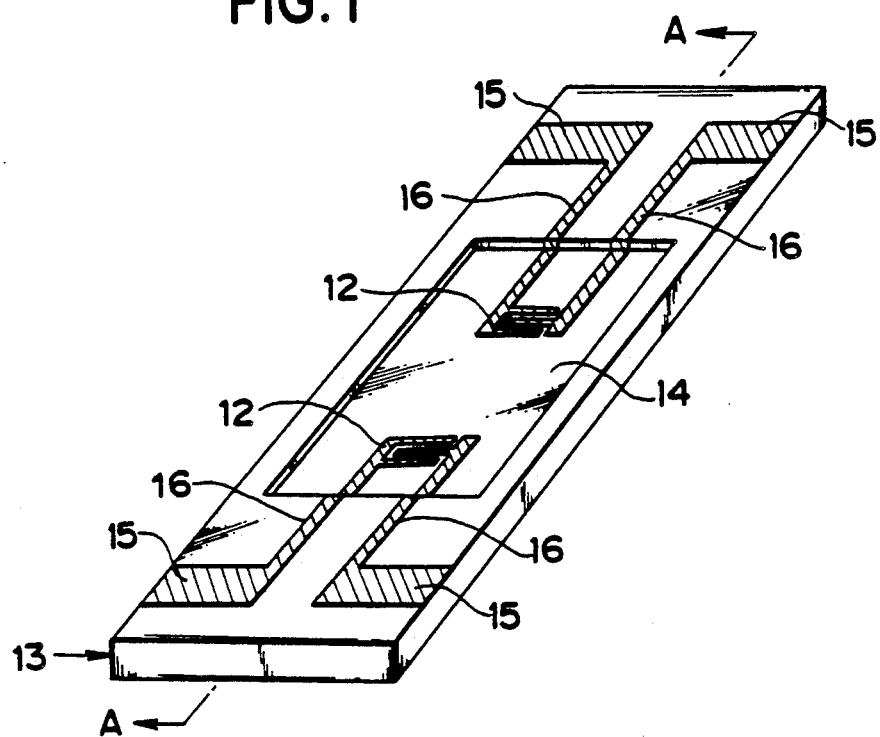
FIG. 1 is a perspective view of a surface acoustic wave element which is an embodiment of the present invention.
Figure 2:
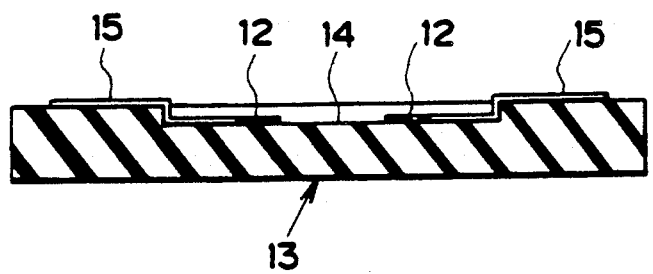
FIG. 2 is a cross-sectional view along the line (A—A) in FIG. 1.

FIG. 1 is a perspective view of a surface acoustic wave filter sealed by the present embodiment and FIG. 2 is a cross-sectional view along the line (A—A) in FIG. 1. In these figures, two transducers 12 exciting surface acoustic wave and a propagating portion are disposed in a recess portion 14 formed in the surface portion of a piezoelectric substrate 13 by etching, etc. In- and output electrode pads 15 are disposed outside of the recess portion 14 (protruding portion) and bus bars of the transducers 12 and the pads 15 are connected by taking-out electrodes 16 traversing the step, which is the boundary between the recess portion and the protruding portion.

Figure 3:
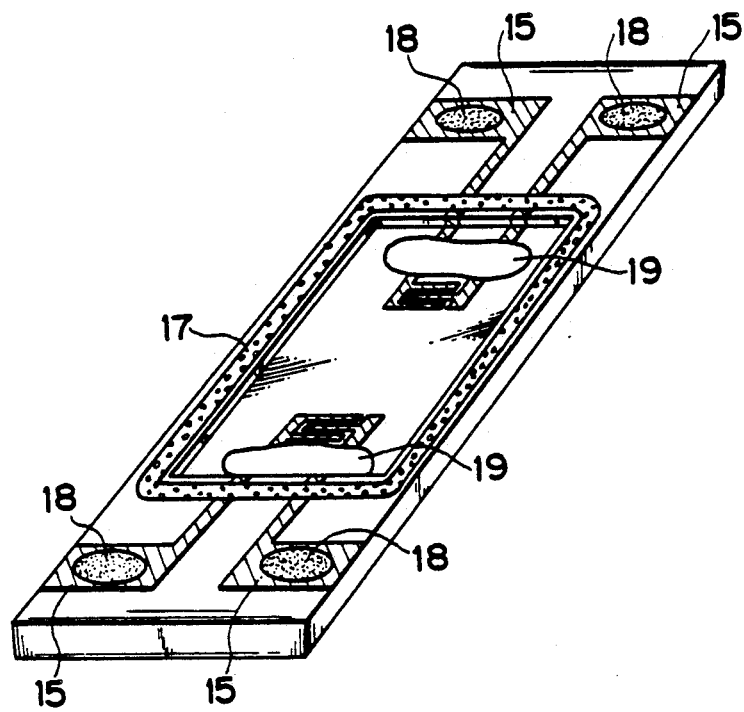
FIG. 3 is a perspective view of a surface acoustic wave element, to which adhesive and sound absorber are applied.

The sealing of the transducers 12 and the propagating portion is performed as follows. At first, as indicated in FIG. 3, insulating adhesive 17 is applied to the neighborhood of the recess portion 14 and conductive paste 18 to the pads 15. Further sound absorber 19 absorbing unnecessary reflected surface acoustic wave is applied to predetermined regions in the recess portion.

Figure 4:
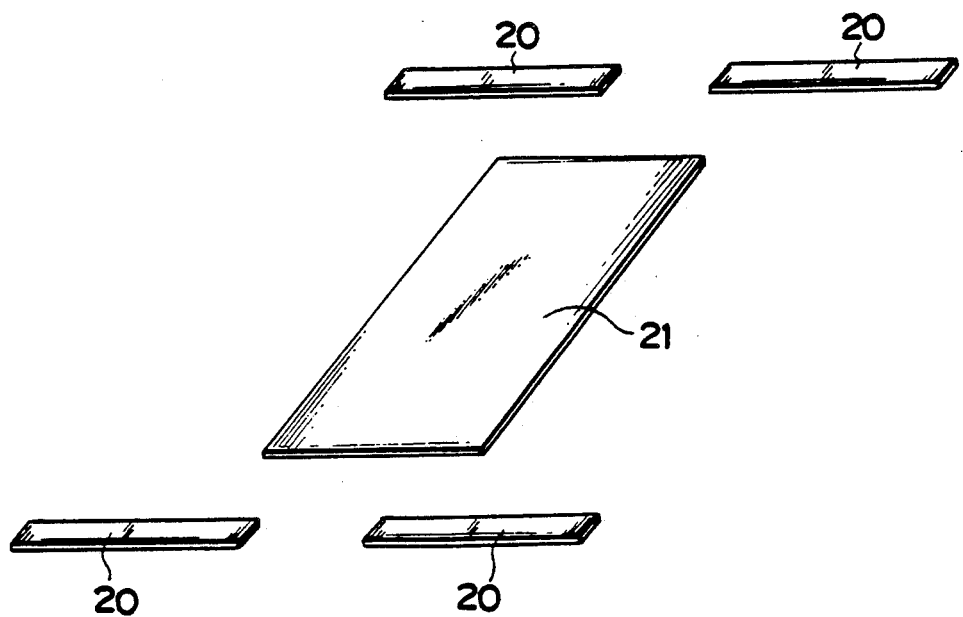
FIG. 4 is a perspective view illustrating lead terminals and a cap.
Figure 5:
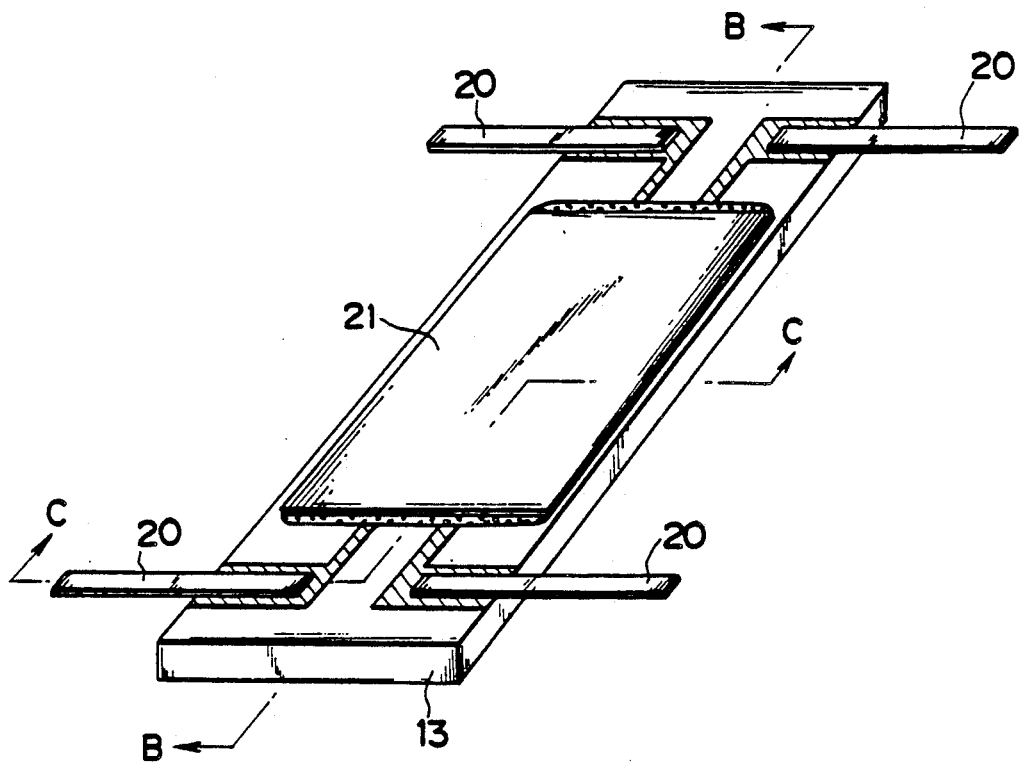
FIG. 5 is a perspective view of an element, on which the cap is mounted.
Figure 6:
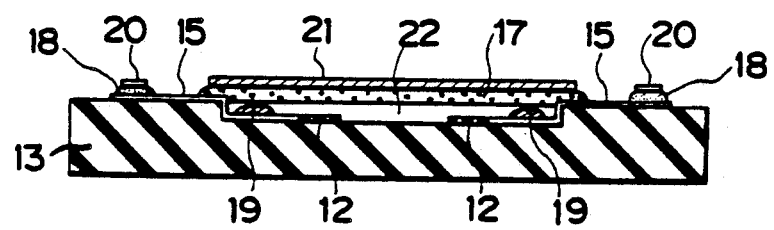
FIG. 6 is a cross-sectional view along the line (B—B) in FIG. 5.

Next lead terminals 20 and a plate-shaped cover 21 covering the recess portion 14 of the substrate as indicated in FIG. 4 are prepared and they are closely adhered to the element as indicated in FIG. 5. FIG. 6 is a cross-sectional view along the line (D—D) in FIG. 4. An air gap is formed over the exciting portions and the propagating portion by covering the recess portion 14 with the cover 21 stated above.

Figure 7:
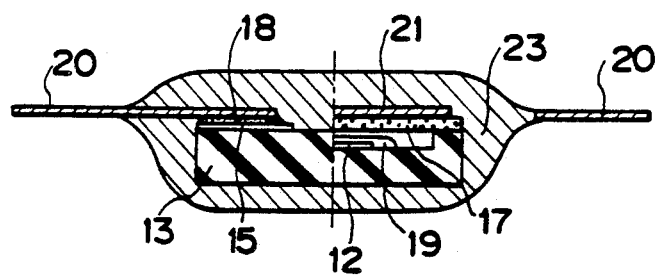
FIG. 7 is a cross-sectional view along the line (C—C) in FIG. 5.

Finally, after the conductive paste, the adhesive and the sound absorber have been solidified, a resin mold 23 is formed on the whole, as indicated in FIG. 7. This FIG. 7 indicates a cross-sectional view along the line (C—C) in FIG. 5.

By using the structure described above, it is possible to form the resin mold, in the state where the air gap is left over the exciting portions and the propagating portion of the surface acoustic wave element, without using any expensive metallic package.

Figure 8:
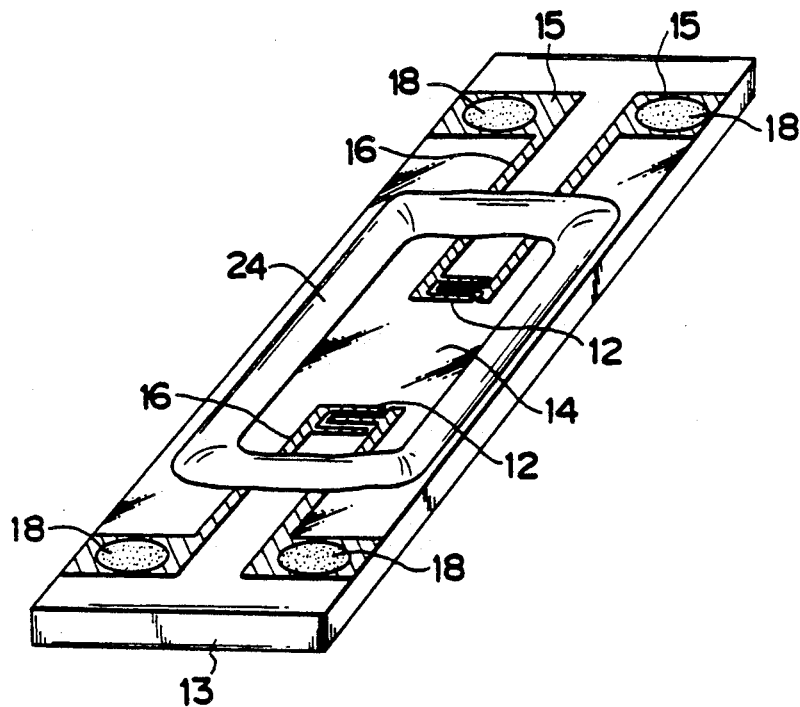
FIG. 8 is a cross-sectional view of a surface acoustic wave element, which is another embodiment of the present invention.

FIG. 8 shows a structure, for which the fixation of the cover covering the recess portion 14 and the absorption of unnecessary surface acoustic wave can be effected in common by the absorber 24 applied to band-shaped regions striding over the peripheral step of the recess portion 14. In this way, it is possible to intend to reduce the number of fabrication steps.

Figure 9:
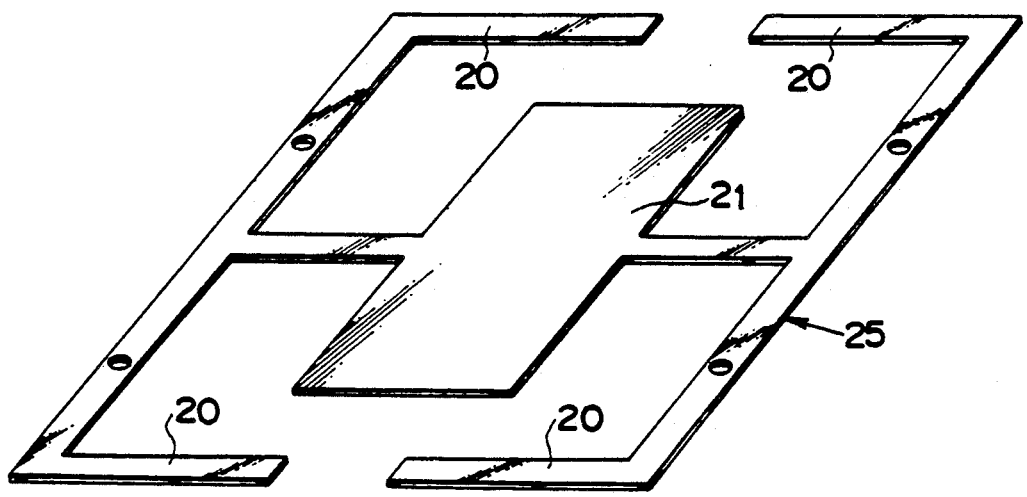
FIG. 9 is a perspective view of a lead frame.
Figure 10:
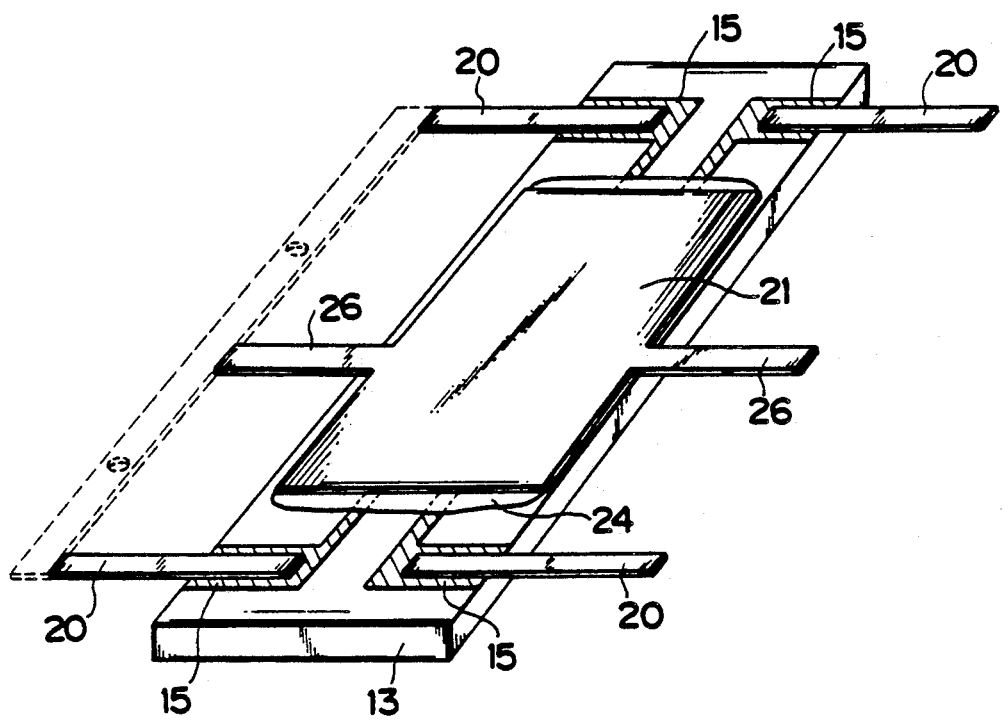
FIG. 10 is a perspective view of a surface acoustic wave, on which the lead frame is mounted.

FIG. 9 shows the in- and output lead terminals and the cover for forming the air gap formed in one body in a lead frame 25. FIG. 10 shows a state where this lead frame 25 is closely adhered to an element.

By using the structure described above, the fabrication step of mounting the lead terminals and the cover is simplified and further the positioning thereof is made easier. Still further, since the cover portions is metallic, it is possible to improve characteristics by extending a terminal 26 therefrom, serving as an earth terminal, which gives rise to an effect as a shield plate.

Figure 11:
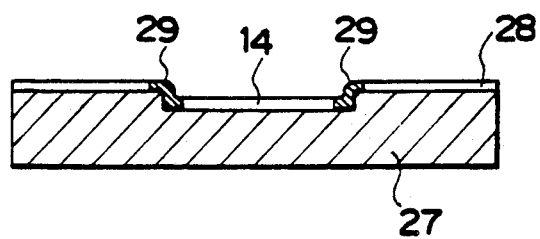
FIG. 11 is a cross-sectional view of the construction of a substrate which is still another embodiment of the present invention.

FIG. 11 is a cross-sectional view of a substrate, an example of a layered structure, in which the piezoelectric substrate constituting the element consists of a semiconductor layer 27 and a piezoelectric thin film 28 superposed thereon.

For the example described above, the shape of the desired recess portion 14 is formed by etching, etc. in the surface portion of a semiconductor layer and the piezoelectric thin film is superposed thereon. There is a possibility that the quality of the film is lowered by abnormal growth, etc. at the thin film portion 29 in the neighborhood of the step. However, since this part is a region giving the operation of the element essentially no influences, this gives rise to no serious problem, if the recess portion has a suitable margin.

In this way, since it is possible to form the device in one body with an electric integrated circuit by using the composite substrate with the semiconductor so that the whole can be molded with resin, it is possible to realize a cheap composite function element.

As the combination of the semiconductor and the piezoelectric thin film, zinc oxide (ZnO) thin film/silicon substrate (Si) and aluminum nitride thin film (A/N)-/sapphire substrate ($A_2O_3$) can be used.

Figure 12:
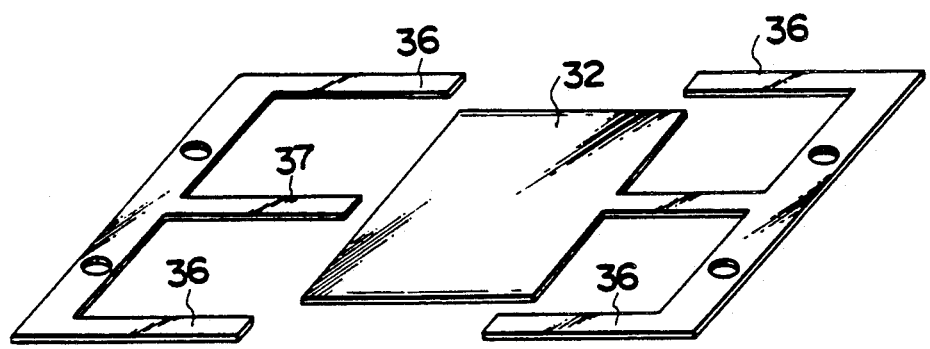
FIG. 12 is an exploded perspective view of a surface acoustic wave element which is still another embodiment of the present invention.
Figure 12:
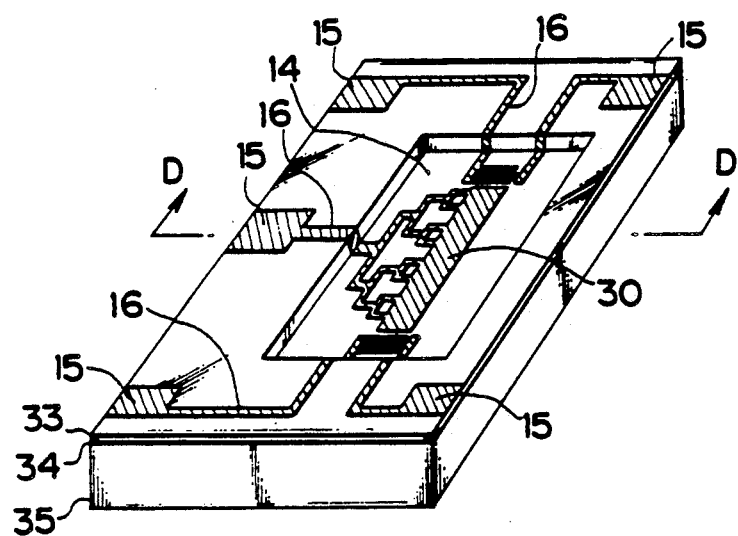
Figure 12:
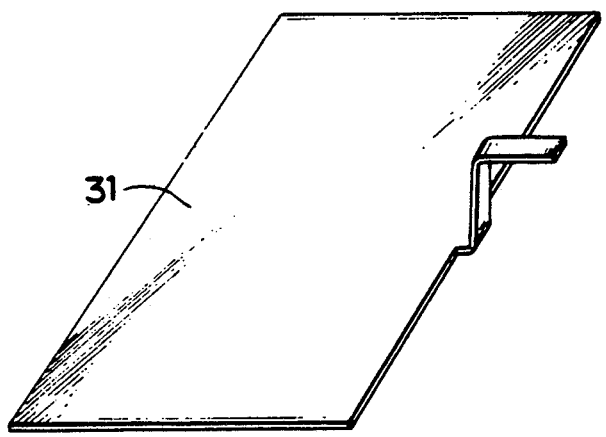
Figure 13:
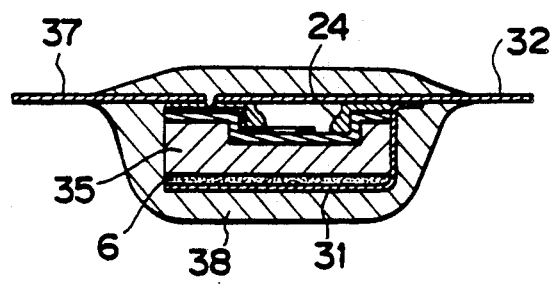
FIG. 13 is a cross-sectional view along the (D—D) in FIG. 12.
Figure 14:
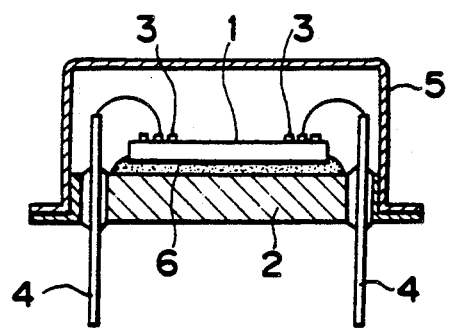
FIGS. 14 and 15 are cross-sectional views of different prior art surface acoustic wave devices.
Figure 15:
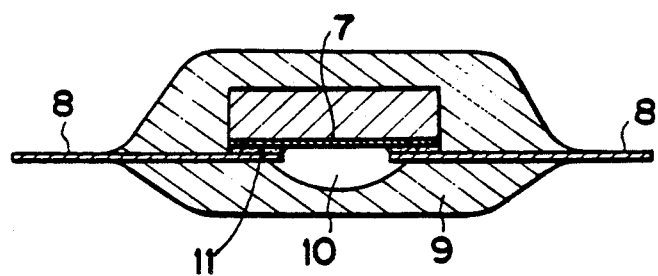

FIGS. 12 and 13 illustrate an embodiment, for which the present invention is applied to a monolithic surface acoustic wave convolver.

FIG. 12 is an exploded perspective view thereof and FIG. 13 is a cross-sectional view along the line (D—D) in FIG. 12, where reference numeral 30 is an output gate electrode; 31 is a rear side electrode; 32 is a shield plate covering the recess portion 14; 33 is a ZnO thin film; 34 is an $SiO_2$ oxide insulating layer; 35 is an Si substrate; 36 is an input lead terminal; 37 is an output lead terminal; and 38 is mold resin.

That is, in a $ZnO/SiO_2/Si$ surface acoustic wave convolver, since the propagating portion and the output signal generating portion exist in an approximately same region, apart from the exciting portions and the propagating portion there is disposed the output gate electrode 30 on the substrate. Further, since the output signal is taken out between the rear side of the substrate and the gate electrode, the rear side earth electrode 31 is necessary. This electrode is connected with the shield plate 32 covering the recess portion 14. In this way, as indicated in FIG. 13, it can be taken out to the exterior as one common earth terminal.

As explained above according to the present invention, it is possible to form a resin mold in the state where the air gap is left over the exciting portions and the propagating portion of the surface acoustic wave element and to realize to lower the cost and to increase the fabrication yield of the surface acoustic wave element.

What is claimed is:

1. A surface acoustic wave device comprising:
   a substrate having a piezoelectric outer surface on one side, said substrate having on said one side a recessed portion extending part-way through said substrate to define a recess with a piezoelectric floor on which a pair of spaced excitation portions are applied, each excitation portion having excitation transducer electrodes formed on the piezoelectric surface of said recess floor and a propagating portion between said excitation portions;
   taking-out electrodes applied upon said substrate and extending from each of said transducer electrodes to the surface of said substrate outside of said recessed portion;
   a plate-shaped covering body covering said recessed portion, said recessed portion being sufficiently deep that an air gap remains on the inner side of said covering body over said exciting portions and said propagating portion;
   an encapsulation body sealingly covering at least the outer surfaces of said covering body; and
   leads connected to said take-out electrodes and projecting beyond said encapsulation body to make connection to an external circuit.

2. A surface acoustic wave device according to claim 1 wherein said covering body is fixed to said subtrate by adhesive applied to the surface of said substrate along and outside the margins of said recessed portion.

3. A surface acoustic wave device according to claim 2 wherein said adhesive is made of a sound-absorbing material.

4. A surface acoustic wave device comprising:
   a layered substrate including at least an insulating base and a piezoelectric thin film disposed on said base, said base and piezoelectric film having a recessed portion formed thereon having a pair of spaced acoustic wave excitation portions formed on said piezoelectric film and each having excitation transducer electrodes formed thereon and a propagating portion between said excitation portions and a conductive area formed on said propagating portion;
   taking-out electrodes on said piezoelectric film extending from each of said transducer electrodes and conductive area to the surface of said substrate outside of said recessed portion;
   a covering body comprising a plate covering said recessed portion, said recessed portion being sufficiently deep that an air gap remains on the inner side of said covering body over said exciting portions and said propagating portion;
   an encapsulation body sealingly covering at least the outer surfaces of said plate; and leads connected to said take-out electrodes and projecting beyond said encapsulation body to make connection to an external circuit.

5. A surface acoustic wave device according to claim 1 or 4 wherein said leads and said covering body are initially formed as one substantially coplanar body in a lead frame which is then cut to separate the same.

6. A surface acoustical wave device according to claim 1 or 4 wherein said encapsulating body sealingly covers all outer surfaces of said covering body, all outer surfaces of said substrate, and both sides of the interior portions of said leads, the outer ends of which project beyond said encapsulating body.

7. A surface acoustic wave device comprising:
a substrate, one side of said substrate having opposite end surfaces interconnected by side surfaces, said end and side surfaces defining the margins of a recess extending part way through said substrate and having a piezoelectric surface floor, said substrate having conductive acoustic wave excitation portions disposed on the piezoelectric floor of said recess, spaced conductive pads on said one side of the substrate, conductive areas applied to said substrate surfaces and to the defining walls of said recess for interconnecting said conductive pads and excitation portions, a covering body adhesively secured over said recess along the margins of said recess and defining an air gap in said recess between said recess floor and covering body, conductive leads conductively secured to said pads, and an encapsulation body applied over the outer surfaces of said covering body and substrate, with said leads projecting from said encapsulating body.

8. The acoustic wave device of claim 7 wherein said end and side surfaces of said substrate are coplanar.

9. The acoustic wave device of claim 7 wherein said excitation portions are opposite said end surfaces, a pair of said conductive pads are provided on each of said end surfaces of said substrate, with a pair of said conductive areas extending from each of said pair of pads to the adjacent acoustic wave excitation portion.

10. The acoustic wave device of claim 7 wherein said adhesive extends onto the floor of said recess to form a sound absorber preventing acoustic wave deflection thereat.

11. The acoustic wave device of claim 1, 4 or 7 wherein said recess floor has applied thereto a first conductive area between said excitation portions and other conductive areas on the defining walls of said recess and on said one side of said substrate outside of said recess for electrically coupling said first conductive area to the exterior of said device, and a conductive lead connected to a portion of said other conductive areas and projecting beyond said encapsulation body to provide electrical connection to an external circuit.

12. The surface acoustic wave device of claim 1, 4 or 7 wherein said covering body covers and seals over the entire marginal portion of the recess in the substrate.

13. The surface acoustic wave device of claim 1, 4 or 7 wherein said air gap is provided over the entire inner side of said covering body.

* * * * *

UNITED STATES PATENT AND TRADEMARK OFFICE
CERTIFICATE OF CORRECTION

PATENT NO. : 4,993,000
DATED : February 12, 1991
INVENTOR(S) : Teruo Niitsuma and Syuichi Mitsutsuka It is certified that error appears in the above-identified patent and that said Letters Patent is hereby corrected as shown below:

Title page, please insert the following text:

[73] Assignee: Clarion Co., Ltd., Tokyo Japan

Signed and Sealed this

Twenty-fifth Day of June, 1991

Attest:

HARRY F. MANBECK, JR.

Attesting Officer

Commissioner of Patents and Trademarks